(12) United States Patent
Carter et al.

(10) Patent No.: US 8,113,888 B2
(45) Date of Patent: Feb. 14, 2012

(54) CIRCUIT BOARD FOR ELECTRICAL CONNECTOR AND ELECTRICAL CONNECTOR

(75) Inventors: Michael Albert Carter, Green Point (AU); Scott David Lee, Terrigal (AU)

(73) Assignee: ADC GmbH, Berlin (DE)

( * ) Notice: Subject to any disclaimer, the term of this patent is extended or adjusted under 35 U.S.C. 154(b) by 0 days.

(21) Appl. No.: 12/935,241

(22) PCT Filed: Apr. 29, 2009

(86) PCT No.: PCT/EP2009/003097
§ 371 (c)(1),
(2), (4) Date: Sep. 28, 2010

(87) PCT Pub. No.: WO2009/138168
PCT Pub. Date: Nov. 19, 2009

(65) Prior Publication Data
US 2011/0014818 A1    Jan. 20, 2011

(30) Foreign Application Priority Data

May 15, 2008    (AU) ................................ 2008902398

(51) Int. Cl.
*H01R 24/00*    (2011.01)
(52) U.S. Cl. ........................................ 439/676; 439/941
(58) Field of Classification Search .................. 439/660, 439/76.1, 676, 941
See application file for complete search history.

(56) References Cited

U.S. PATENT DOCUMENTS

| | | | |
|---|---|---|---|
| D254,687 S | 4/1980 | Fadler et al. | |
| D255,351 S | 6/1980 | Pettijohn | |
| 5,618,185 A * | 4/1997 | Aekins | 439/76.1 |
| 5,991,162 A | 11/1999 | Saso | |
| 6,089,923 A | 7/2000 | Phommachanh | 439/676 |
| D429,704 S | 8/2000 | Kang | |
| 6,418,030 B1 | 7/2002 | Yamaguchi et al. | |
| D466,093 S | 11/2002 | Ebihara et al. | |
| 6,483,715 B1 * | 11/2002 | Chen | 361/760 |
| 6,533,618 B1 | 3/2003 | Aekins | 439/676 |
| D474,773 S | 5/2003 | Kondo | |

(Continued)

FOREIGN PATENT DOCUMENTS

JP    2006-40585    2/2006

(Continued)

OTHER PUBLICATIONS

International Search Report for PCT/EP2009/003097 (Form PCT/ISA/210), Aug. 18, 2009.

(Continued)

*Primary Examiner* — Javaid Nasri
(74) *Attorney, Agent, or Firm* — Merchant & Gould P.C.

(57) ABSTRACT

A circuit board for an electrical connector includes a plurality of pairs of first contacts disposed at a first end of the circuit board and a plurality of pairs of second contacts disposed at a second end. Each first contact is connected to a second contact by first conductors disposed at least on a first side of the circuit board. Second conductors are disposed on the circuit board and connected to a first contact or a second contact. A second conductor is associated with a first contact of each pair of first contacts and a second contact of each pair of second contacts. Adjacent second conductors of the first contacts include segments at least partially parallel to each other, forming first coupling regions. Adjacent second conductors of the second contacts include segments at least partially parallel to each other, forming second coupling regions.

16 Claims, 4 Drawing Sheets

U.S. PATENT DOCUMENTS

| | | |
|---|---|---|
| 6,665,930 B2 | 12/2003 | Matuschik |
| 2003/0117784 A1 | 6/2003 | Fukunabe et al. |
| 2004/0055782 A1 | 3/2004 | Yamamoto |
| 2007/0205017 A1 | 9/2007 | Takakusaki et al. |
| 2007/0230145 A1 | 10/2007 | Yamamoto |

FOREIGN PATENT DOCUMENTS

| | | |
|---|---|---|
| WO | WO 2004/010536 | 1/2004 |
| WO | WO 2008/119370 | 10/2008 |

OTHER PUBLICATIONS

Photographs of a commercial product by ADC Krone, Highband 8 Printed Circuit Board, 2 Photographs, front and back images, admitted prior art as of May 15, 2008.

Photographs of a commercial product by ADC Krone, Highband 25 Printed Circuit Board, 2 Photographs, front and back images, admitted prior art as of May 15, 2008.

* cited by examiner

15 # CIRCUIT BOARD FOR ELECTRICAL CONNECTOR AND ELECTRICAL CONNECTOR

This application is a National Stage Application of PCT/EP2009/003097, filed 29 Apr. 2009, which claims benefit of Serial No. 2008902398, filed 15 May 2008 in Australia and which applications are incorporated herein by reference. To the extent appropriate, a claim of priority is made to each of the above disclosed applications.

BACKGROUND

The invention relates to a printed circuit board for an electrical connector and to an electrical connector.

When a cable having twisted wires is terminated on a printed circuit board (PCB), the wires must be untwisted and spread out so that the wires can be terminated in a line along one edge of the PCB. This untwisting of the wires introduces adverse inductive signal couplings between some of the wires (crosstalk). Additionally, further adverse inductive signal coupling to the wires or other conductors in the electrical connector may result because of the configuration of the connector itself, as well as the relative positions of conductors within the electrical connector.

Many electrical connectors are of a small size, which necessitates that any PCBs used by those connectors are also small. Accordingly, the available space for running conductors across the PCB of an electrical connector is limited.

SUMMARY

The invention is based on the technical problem of providing a printed circuit board for an electrical connector and also such a connector by means of which signal couplings can be compensated for.

For this purpose, the printed circuit board for an electrical connector comprises a plurality of pairs of first contacts arranged at a first end of the printed circuit board and a plurality of pairs of second contacts arranged at a second end, wherein a first contact is respectively connected to a second contact via first circuit traces, wherein the first circuit traces are arranged at least on a first side of the printed circuit board, wherein second circuit traces are arranged on a further side of the printed circuit board, said second circuit traces being connected to a first contact or a second contact, wherein a first contact of a pair of first contacts is respectively assigned a second circuit trace, wherein the adjacent second circuit traces of the first contacts have at least partly parallel portions with respect to one another, and a second contact of a pair of second contacts is respectively assigned a second circuit trace, wherein the adjacent second circuit traces of the second contacts have at least partly parallel portions with respect to one another, wherein the first contacts connected to the second circuit traces are not connected to the second contacts connected to the second circuit traces, wherein the second circuit traces at the first contacts form first coupling regions and the second circuit traces at the second contacts form second coupling regions.

In one preferred embodiment, a first circuit trace of a pair of contacts respectively crosses the other first circuit trace of the pair of contacts by means of plated-through holes, as a result of which a further compensation region or coupling region is provided. Preferably, therefore, the associated first and second contacts at the opposite ends also lie crosswise in pairs. The first circuit traces that are associated in pairs in this case preferably extend in a substantially parallel fashion wherein, with further preference, the crossing point of the circuit traces lies in the vicinity of the second contacts.

In a further preferred embodiment, the second circuit traces are connected to the second contacts via the plated-through holes.

In a further preferred embodiment, slots are introduced into the printed circuit board between the pairs of second contacts and/or slots are introduced between the contacts of a pair of second contacts.

Preferably, the second coupling regions are at least partly arranged between the slots and the first coupling regions.

The lengths of the first inductive coupling regions (parallel portions of the second circuit traces) are preferably less than lengths of the second inductive coupling regions (parallel portions of the second circuit traces). The lengths of the individual first inductive coupling regions and/or the second inductive coupling regions are preferably not uniform but rather each of different lengths. Each of the first inductive coupling regions may be oriented substantially perpendicularly to at least part of a respective one of the second inductive coupling regions. The first inductive coupling regions may be disposed substantially adjacent the respective second inductive coupling regions.

The first inductive coupling regions may be longitudinally aligned with respective ones of the slots, i.e. they are parallel to the longitudinal direction of the slot. Each of the second circuit traces that is coupled to one contact of the second contact pair may extend around an inner end of a respective slot.

The parallel and adjacent portions of the second circuit traces may be disposed so as to substantially nest with each other in the second inductive coupling regions.

A ratio of the length of at least one second inductive coupling region to the length of a respective at least one first inductive coupling region may be about 1.1:1 or greater. The ratio may be about 3:1 or less. More specifically, the ratio may be between 1.25:1 and 2.5:1. The ratio may be different for different ones of associated first and second inductive coupling regions. The length of the printed circuit board from the first end to the second end may be about 35 mm. A central slot may be longer than all the other slots.

In a further preferred embodiment, the first contacts are embodied as insulation displacement contacts.

Further embodiments relate to an electrical connector comprising the PCB as described above. The PCB may be disposed at least partly within a housing of the electrical connector. The housing may comprise an insulating shield that is movable to expose the second contacts for direct electrical contact.

BRIEF DESCRIPTION OF THE DRAWINGS

Embodiments are described in further detail below, with reference to the accompanying drawings, in which.

DETAILED DESCRIPTION

The described embodiments relate generally to a printed circuit board 100 (PCB) for an electrical connector 400 and to an electrical connector 400 comprising such a PCB 100.

Figure 1:
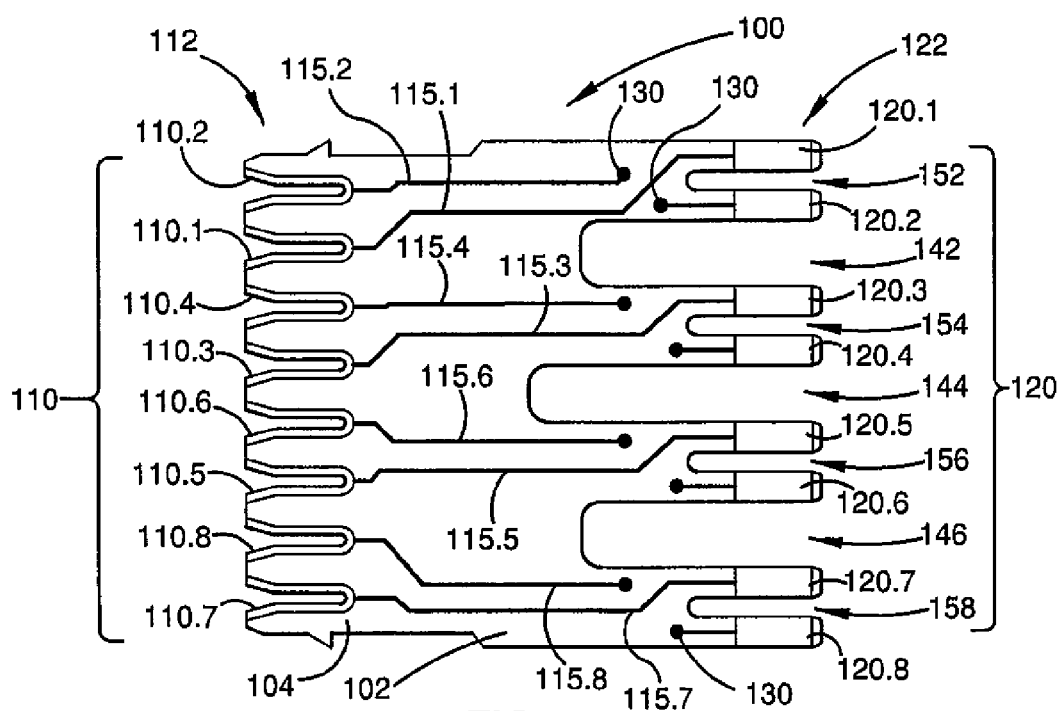
FIG. 1 is a schematic plan view of a first side of a printed circuit board for an electrical connector.
Figure 2:
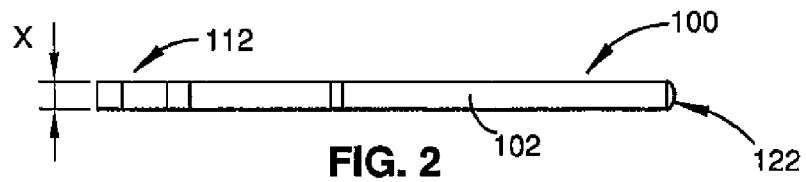
FIG. 2 is a side view of the printed circuit board of FIG. 1.
Figure 3:
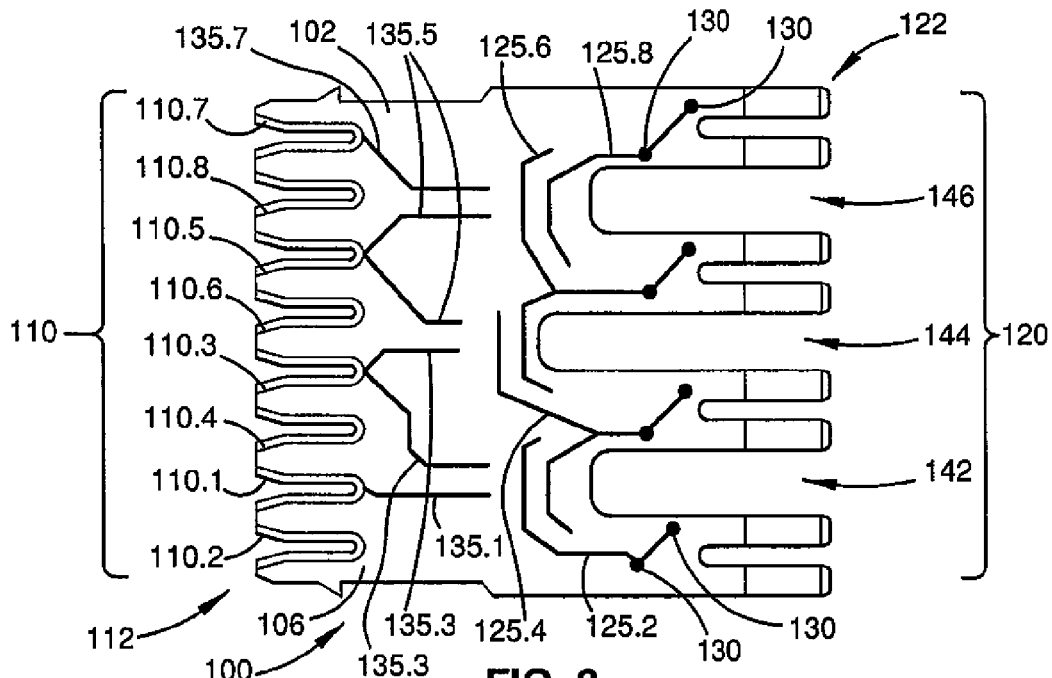
FIG. 3 is a bottom view of a second side of the printed circuit board of FIG. 1.
Figure 4:
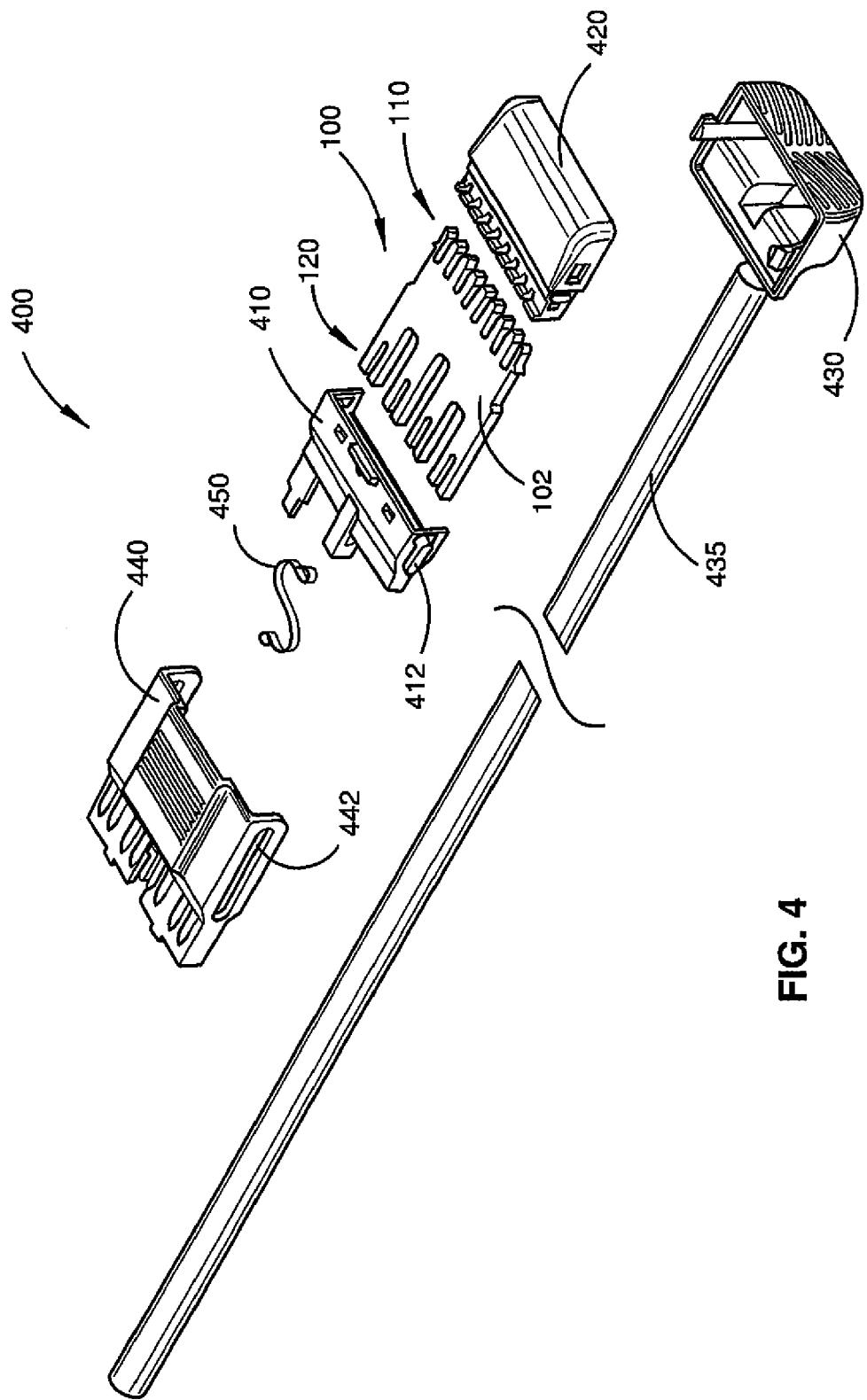
FIG. 4 is an exploded view of an electrical connector with a printed circuit board according to FIG. 1.
Figure 5:
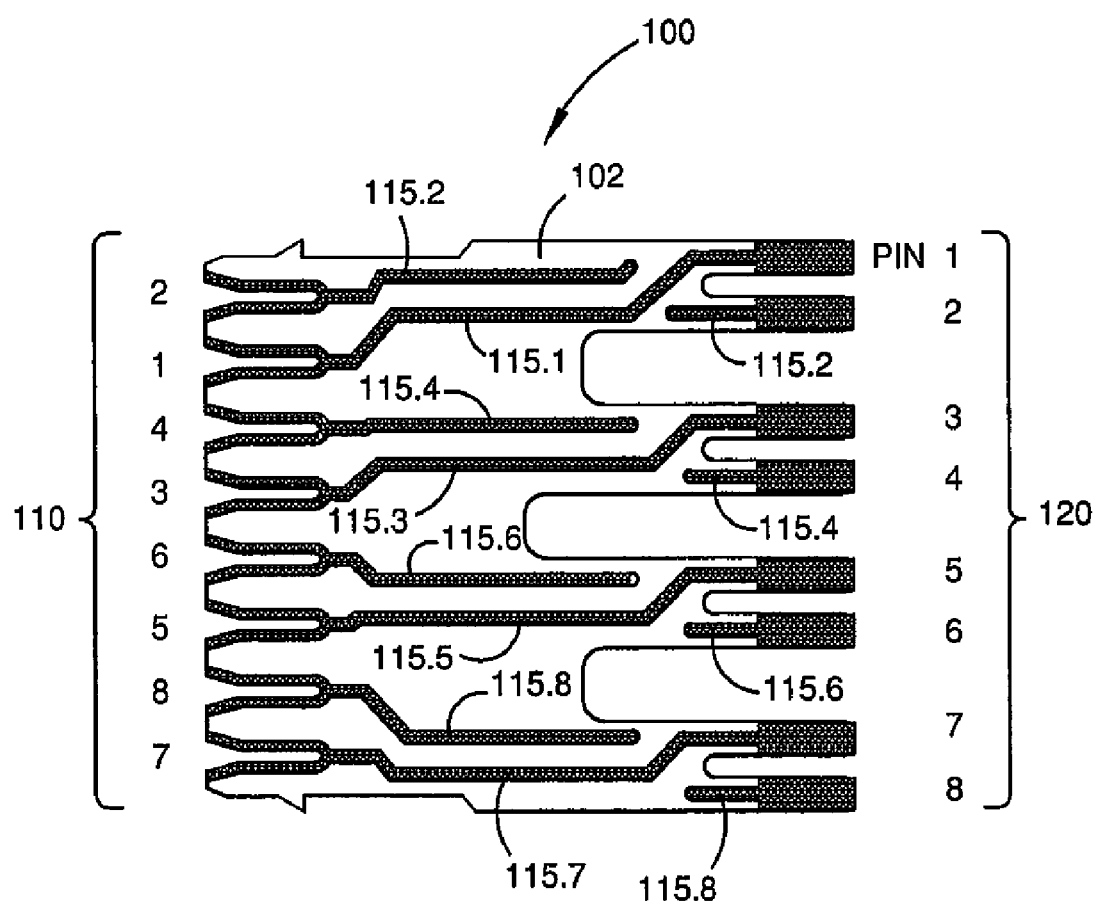
FIG. 5 is a magnified view of circuit traces shown in FIG. 1.
Figure 6:
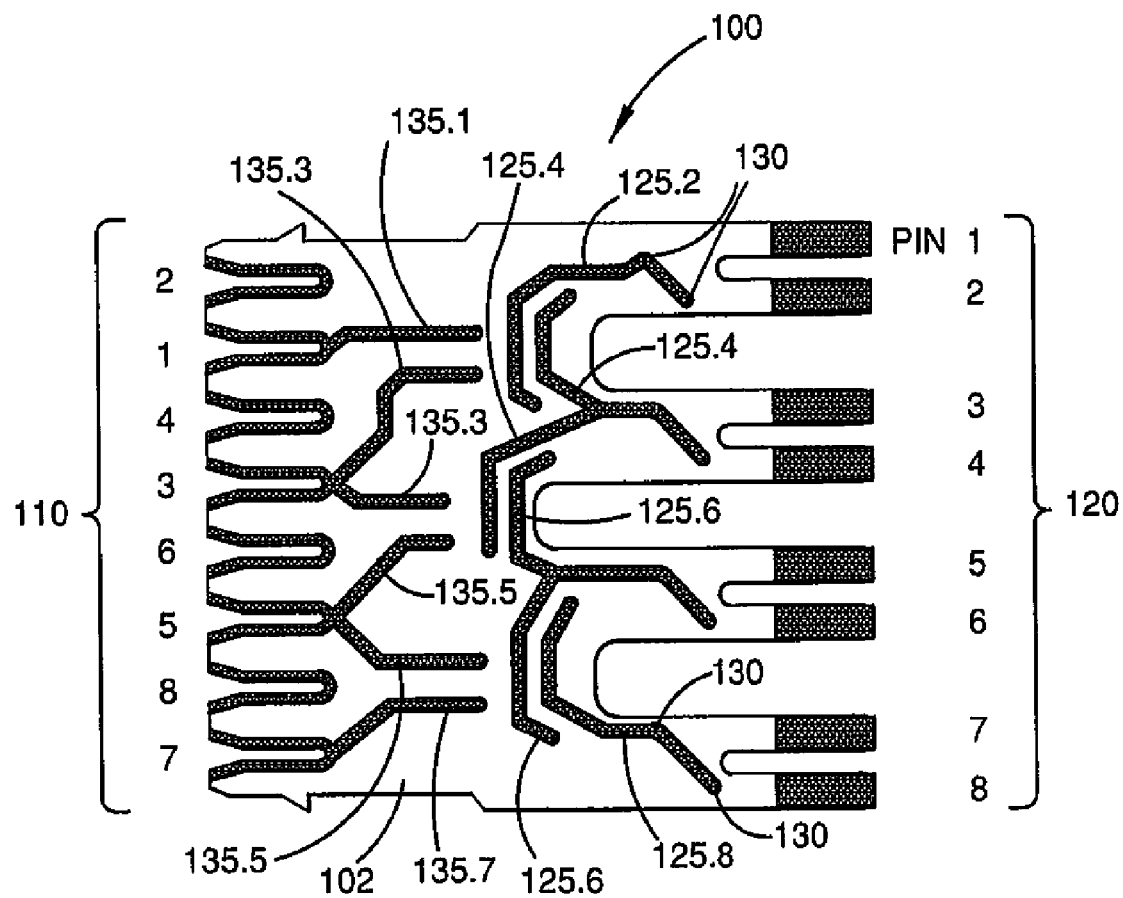
FIG. 6 is a magnified view of circuit traces shown in FIG. 3.

FIGS. 1, 2 and 3 are schematic illustrations of a PCB 100, while FIG. 4 shows the PCB 100 in the context of its use within an electrical connector 400. FIGS. 5 and 6 illustrate the configurations of electrical circuit traces on each side of the PCB 100.

Referring firstly to FIGS. 1, 2 and 3, PCB 100 is described in further detail. PCB 100 is formed of a fibreglass substrate 102 of thickness X and having electrically conductive contacts and circuit traces positioned thereon or therein. Thickness X may be between 1 to 2 mm, for example around 1.3 mm. PCB 100 has a plurality of first contacts 110 at a first end 112 of the PCB 100 and a plurality of second contacts 120 at a second end 122 of the PCB 100. The first contacts 110 are electrically conductive and formed, for example, as insulation displacement contacts for electrically contacting insulated wires or cores of a cable. The first contacts 110 extend to both sides 104, 106 of the PCB 100. The second contacts 120 are electrically conductive and comprise pin contacts that are intended to be received by spring contacts in a component to which the electrical connector 400 is to be connected.

PCB 100 has a first set of first circuit traces 115 printed onto first sides 104 of the substrate 102, for example using an etching process. The first circuit traces 115 may be about 1 mm in width and, for example, be formed of copper. Each first circuit trace 115 couples one of the first contacts 110 to one of the second contacts 120 or connects them.

In the examples illustrated in the Figures, PCB 100 has eight contacts 110.1 to 110.8 at the first end 112 and eight contacts 120.1 to 120.8 at the second end 122, with eight circuit traces 115.1 to 115.8 connecting respective first contacts 110.1 to 110.8 with second contacts 120.1 to 120.8.

As first part of a compensation arrangement for mitigating the effects of cross-talk introduced by the separated and untwisted conductors of the cable and the electrical connector, every other one of circuit traces 115 (e.g. 115.2, 115.4, 115.6 and 115.8) is configured to cross over its circuit trace 115 associated in pairs (e.g. 115.1, 115.3, 115.5 and 115.7) preferably at right angles. This is done by having one circuit trace (115.2, 115.4, 115.6 and 115.8) of each circuit trace pair extend through through-holes 130 in substrate 102 of the PCB 100 from the first side 104 to the second side 106 of the PCB 100, where it crosses the unbroken circuit trace (115.1, 115.3, 115.5, 115.7) and is led back to the first side 104 via a further through-hole 130 in order finally to be connected to the second contacts 120. Alternatively, the first circuit trace can also be connected to the second contacts 120 on the second side 106, with the result that the second through-hole 130 can be obviated. This presupposes that the second contacts 120 extend, like the first contacts 110 onto both sides 104, 106.

For example, as illustrated in FIGS. 1 and 3, circuit trace 115.1 is unbroken on the first side 104, while circuit trace 115.2 has its path on the first side 104 broken by through-holes 130 or plated-through holes, in which conductive material is disposed for maintaining electrical connection between circuit traces on the first and second sides 104, 106. Thus, circuit trace 115.2 effectively continues its path briefly on the second side 106 in between the points of through-holes 130. This conducting section between through-holes 130 on second side 106 preferably travels at right angles to an angled section of circuit trace 115.1 on first side 104, with the circuit traces 115 not physically contacting each other as they cross because they are positioned on opposed sides 104, 106 of the fibreglass substrate 102.

Adjacent circuit traces 115 on first side 104 are effectively paired with each other. In this way, circuit trace 115.1 and 115.2, circuit trace 115.3 and 115.4, circuit trace 115.5 and 115.6 and also circuit trace 115.7 and 115.8 are paired. For each such pairing of first circuit traces 115, the circuit traces of each pair run parallel to each other for a substantial part of their length, as is evident in the example illustrated in FIG. 1. Along the parts of the conductor pairs where the circuit traces 115 are parallel and adjacent to each other, inductive coupling of signals from one circuit trace 115 to the other circuit trace 115 occurs. This inductive coupling can be selected and configured to compensate for cross-talk within electrical connector 400 (but external of the PCB 100) to thereby reduce corruption of the signal travelling via each circuit trace 115. Such corruption can lead to an unacceptably high error rate, which reduces the maximum communication speed of the electrical connector 400.

In order to improve the compensation effect of inductive coupling between the pairs of circuit traces 115, second circuit traces 125 and 135 are arranged on second side 106. Circuit traces 125 and 135 may be about 1 mm wide and may be formed of copper using an etching process. Circuit traces 125 and 135 are configured to provide further amounts of inductive coupling among non-adjacent ones of circuit traces 125 and 135 as a way of fine-tuning the compensation provided by the inductive coupling among circuit traces 115 to achieve a balanced overall inductive coupling among first circuit traces 115 and second circuit traces 125, 135. This balanced inductive coupling helps to reduce the error rate and thereby allow a higher transmission bit rate through electrical connector 400.

Second circuit traces 125 are coupled to the first circuit traces 115 or the second contacts 120 via through-holes 130 positioned toward second end 122. The second circuit traces 125 are only coupled to every alternate one of first circuit traces 115. Thus, in the example shown in FIG. 3, second circuit traces 125.2, 125.4, 125.6 and 125.8 are coupled via through-holes 130 to first circuit traces 115.2, 115.4, 115.6 and 115.8, respectively.

Similarly, second circuit traces 135 are coupled to every alternate one of first circuit traces 115 via respective first contacts 110. Thus, in the examples shown in FIG. 3, second circuit traces 135.1, 135.3, 135.5 and 135.7 are coupled to first circuit traces 115.1, 115.3, 115.5 and 115.7 via respective first contacts 110.1, 110.3, 110.5 and 110.7.

As illustrated in FIGS. 1 and 3, second contacts 120 are each separated from the one or two neighbouring contacts by one or two slots formed in substrate 102 of PCB 100 and extending inwardly from second end 122 in a longitudinal direction toward first end 112. Such slots are for separating contacts 120 and to accommodate mechanical structures in a receiving socket in which second end 122 of PCB 100 will be received when electrical connector 400 is in use.

In the examples illustrated in FIGS. 1 and 3, the eight contacts 120.1 to 120.8 are separated by seven slots 142, 144, 146, 152, 154, 156 and 158. The middle slot 144 of the seven slots is located in the lateral centre of the PCB and is the longest of the slots, about 18 mm in length. On either lateral side of slot 144 are smaller slots 154 and 156, each being less than half of the length of middle slot 144, or about 8 to 8.5 mm, and less than half the width of middle slot 144. Middle slot 144 is located between contacts 120.4 and 120.5 while the shorter slot 154 is located between contacts 120.3 and 120.4 and shorter slot 156 is located between contacts 120.5 and 120.6. Shorter slots 152 and 158 are of the same dimensions as slots 154 and 156 and are located between contacts 120.1 and 120.2 and 120.7 and 120.8 respectively. Slots 142 and 146 are shorter than middle slot 144, but have about the same width. Slot 142 is located between contacts 120.2 and 120.3, while slot 146 is located between contacts 120.6 and 120.7. Slots 142 and 146 have the same dimensions and are both about 15 mm in length.

The (longitudinal) length of PCT 100 from first end 112 to second end 122 may be about 35 mm, while the lateral width may be about 30 mm at the second end 122. Substrate 102 is tapered in a section of its outer lateral edges, so that the lateral width of PCB 100 at first end 112 is less than the lateral width at second end 122 by about 1 mm to 2 mm.

Referring now to FIG. 4, electrical connector 400 is described in further detail. Electrical connector 400 has a lower shell 410, an upper shell 420, a cable connector part 430 and an insulating shield 440. Lower shell 410 and upper shell 420 are connectable so as to at least partially enclose PCB 100. First contacts 110 are positioned within second shell 420 so as to be able to receive wires from a cable 435 that is untwisted and spread out through cable connector part 430. Second contacts 120 partially or fully protrude through lower shell 410.

Electrical connector 400 also comprises a biasing member 450, such as a spring, for biasing insulating shield 440 toward a first position in which insulating shield 440 covers and substantially shields second contacts 120 from direct manual contact. Insulating shield 440 is slideably movable along the coupled lower and upper shells 410, 420 between the first position and a second position in which insulating shield 440 is retracted to expose second contacts 120 for direct connection to a receiving socket having spring contacts. Biasing element 450 is resiliently deflectable and biases insulating shield 440 away from the second position and toward the first position.

Cable connector part 430 is connectable to upper shell 420 according to a snap fitting engagement. Insulating shield 440 is coupled to lower shell 410 by receipt of registering protrusions 412 within slots 442 on each side of insulating shield 440. Slots 442 are formed with sufficient length to allow insulating shield 440 to travel between the first and second positions, while maintaining registration of protrusions 412 therein.

Referring now to FIGS. 5 and 6, the configurations of conductors 115, 125 and 135 on substrate 102 are described in further detail. As illustrated in the example shown in FIG. 5, first circuit traces 115 are arranged in pairs that have a long section in which the circuit traces of each pair are substantially parallel and closely adjacent to each other. These sections may be in the order of about 14 mm in length, and in these sections, the separation of conductors 115 within each pair may be about 1 mm but may be slightly less or more. These parallel and adjacent sections are used as a primary compensation mechanism to compensate for cross-talk induced in other parts of the electrical conductor 400. It may be considered that such cross-talk induces a negative or adverse inductive signal coupling, while the inductive coupling in the parallel and adjacent sections of circuit traces 115 induces a positive or balancing inductive signal coupling to counter the adverse effect of the cross-talk arising in electrical connector 400.

The parallel and adjacent sections of circuit traces 115 may also be considered to be inductive coupling regions having a specific length in which they are substantially parallel and adjacent.

As illustrated in FIG. 6, circuit traces 125 and 135 also have inductive coupling regions where the circuit traces are substantially parallel and adjacent, although the lengths of these regions are shorter than those of circuit traces 115 and vary somewhat from region to region. Unlike circuit traces 115, circuit traces 125 and 135 are coupled to every other one of the first contacts 110 and second contacts 120, as illustrated in FIG. 6. At first end 112, circuit traces 135.1, 135.3, 135.5 and 135.7 are coupled to contacts 110.1, 110.3, 110.5 and 110.7 respectively.

Circuit traces 135.3 and 135.5 each have two branches, while circuit traces 135.1 and 135.7 are formed in only a single branch. One branch of circuit trace 135.3 is arranged to extend toward circuit trace 135.1 so that at least a portion of that branch can form a parallel and adjacent inductive coupling region with circuit trace 135.1 along a longitudinal orientation that aligns with slot 142 (see FIGS. 1 and 3 respectively). Similarly, a second branch of circuit trace 135.3 extends toward a first branch of circuit trace 135.5 to form an adjacent and parallel inductive coupling region with each other in a longitudinal direction aligned with slot 144. The second branch of circuit trace 135.5 extends towards circuit trace 135.7 and those circuit traces both run substantially parallel and adjacent to each other to define another inductive coupling region oriented in a longitudinal direction aligned with slot 146.

Circuit traces 125.2, 125.4, 125.6 and 125.8 are arranged to at least partially run adjacent and parallel to a neighbouring one of those circuit traces. As is illustrated in FIG. 6, circuit traces 125.2 and 125.8 are each formed in only a single branch, while circuit traces 125.4 and 125.6 each have two branches. Each of circuit traces 125 has a portion that runs between through-holes 130 (see FIGS. 1 and 3) that couple each circuit trace 125 to one of the first circuit traces 115. Circuit traces 125 are constrained by slots 142, 144 and 146, in that those slots 142, 144, 146 partially separate each circuit trace 125 from its neighbouring circuit trace 125. Slots 142, 144 and 146 make circuit traces 125 effectively curve or hook around the inner end of those slots 142, 144, 146.

As is evident in the example illustrated in FIG. 6, circuit trace 125.2 extends at least partially longitudinally and hooks around a portion of a first branch of circuit trace 125.4 and slot 142. There is a portion of the inductive coupling region defined by circuit traces 125.2 and 125.4. This inductive coupling region is between slot 142 and the inductive coupling region defined by circuit trace 135.1 and 135.3, the circuit traces 135.1, 135.3 being perpendicular to circuit traces 125.2, 125.4 in portions. The first branch of circuit trace 125.4 also hooks around slot 142 inside of circuit trace 125.2. Thus, circuit traces 125.2 and 125.4 define an inductive coupling region where they are substantially parallel and adjacent to each other. This inductive coupling region is not entirely linear, instead being made up of substantially linear parallel and adjacent portions that are angled with respect to one another. This formation may be described as curved or non-linear, although it is in fact made up of linear segments.

In a similar manner, a second branch of circuit trace 125.4 extends at least partially around slot 144 and nests with a first branch of circuit trace 125.6 to form an inductive coupling region where those circuit traces 125.4, 125.6 are substantially parallel and adjacent to each other. This inductive coupling region is made up of separate angled segments that are each linear, but with the effect that the inductive coupling region as a whole is not linear. At least one segment of the inductive coupling region is disposed in a lateral orientation in a part of substrate 102 that is longitudinally intermediate slot 144 and the inductive coupling region defined by circuit traces 135.3 and 135.5.

A second branch of circuit trace 125.6 nests with circuit trace 125.8 in a manner that defines an inductive coupling region where those circuit traces are substantially parallel and adjacent to each other. This inductive coupling region is composed of linear segments that are angled with respect to each other, with the effect that the inductive coupling region appears to hook around the end of slot 146. At least one segment of the inductive coupling region is orientated laterally and is positioned to be longitudinally intermediate slot 146 and the inductive coupling region defined by circuit traces 135.5 and 135.7.

The inductive coupling regions defined by circuit traces 125 are positioned intermediate slots 142, 144 and 146 and the longitudinally corresponding inductive coupling regions defined by circuit traces 135.

Each of the inductive coupling regions defined by circuit traces 125 and 135 may have a different length. However, each of the inductive coupling regions defined by circuit traces 135 is less than the length of the induced coupling region defined by circuit traces 125 with which it longitudinally corresponds. Thus, for example, the longitudinally oriented inductive coupling region defined by circuit traces 135.1 and 135.3 may be about 5.1 mm in length, while the corresponding inductive coupling region defined by circuit traces 125.2 and 125.4 may have a length of 6.5 mm. This gives a length ratio of about 1.25:1 in favour of the induced coupling region defined by circuit traces 125.2 and 125.4. This ratio may be decreased, for example to about 1.1:1, or it may be increased, depending on the level of fine-tuning of the inductive coupling desired.

In another example, the length of the inductive coupling region defined by circuit traces 135.3 and 135.5 may be about 3.3 mm, while the length of the inductive coupling region defined by circuit traces 125.4 and 125.6 may be about 8.1 mm. This gives a length ratio of about 2.5:1 in favour of the inductive coupling region defined by circuit traces 125.4 and 125.6. This ratio may be increased, for example to about 3:1 or even up to about 5:1, or it may be reduced, depending on the level of fine-tuning of the inductive coupling desired.

In another example, the inductive coupling region defined by circuit traces 135.5 and 135.7 may be about 5.7 mm in length, while the corresponding inductive coupling region defined by circuit traces 125.6 and 125.8 may be about 10 mm in length. This gives a length ratio of about 1.75 in favour of the inductive coupling region defined by circuit traces 125.6 and 125.8. As with the other length ratios described above, this ratio may be modified to increase it or decrease it in order to suitably fine-tune the inductive coupling for compensation of the adverse effects of cross-talk in electrical connector 400. Overall, the lengths of the inductive coupling regions defined by circuit traces 125 should be longer than the lengths of the inductive coupling regions defined by circuit traces 135 by a ratio of between 1.1:1 and 5:1. Such a ratio range may alternatively be between 1.25:1 and 2.5:1.

It should be noted that the configuration of circuit traces shown in FIG. 6 corresponds to that shown in FIG. 3, although FIG. 3 shows the circuit traces as viewed from a bottom side 106, while the view of those circuit traces shown in FIG. 6 is shown from a top side (i.e. looking through first face 104 towards second face 106). It should also be noted that the through-holes 130 or plated-through holes are not shown.

Modifications of the described embodiments may be apparent to those skilled in the art without departing from the spirit and scope of the embodiments as herein described with reference to the accompanying drawings. For example, the PCB may be a multilayer PCB with circuit traces 125, 135 being arranged on intermediate layers.

The reference in this specification to any prior publication (or information derived from it), or to any matter which is known, is not, and should not be taken as an acknowledgment or admission or any form of suggestion that that prior publication (or information derived from it) or known matter forms part of the common general knowledge in the field of endeavour to which this specification relates.

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps.

LIST OF REFERENCE SYMBOLS

100 Printed circuit board
102 Fiberglass substrate
104 First side
106 Second side
110.1-110.8 First contacts
112 First end
115.1-115.8 Circuit traces
120.1-120.8 Second contacts
122 Second end
125.2, 125.4, 125.6, 125.8 Second circuit traces
130 Through-holes
135.1, 135.3, 135.5, 135.7 Second circuit traces
142, 144, 146 Slots
152, 154, 156, 158 Slots
400 Connector
410 Lower shell
412 Protrusions
420 Upper shell
430 Cable connector part
435 Cable
440 Insulating shield
442 Slots
450 Biasing element

The invention claimed is:

1. A printed circuit board for an electrical connector, comprising:
a plurality of pairs of first contacts arranged at a first end of the printed circuit board;
a plurality of pairs of second contacts arranged at a second end of the printed circuit board;
a plurality of slots formed in the printed circuit board and extending inwardly from the second end of the printed circuit board;
first circuit traces arranged at least on a first side of the printed circuit board and connecting each of the first contacts to respective second contacts;
second circuit traces arranged on an opposite side of the printed circuit board from the first side, each of said second circuit traces being connected to a first contact or a second contact, wherein:
a first contact of each pair of first contacts is connected to a second circuit trace from among the second circuit traces, and wherein each of the second circuit traces connected to first contacts include portions at least partly parallel with respect to second circuit traces connected to first contacts of adjacent pairs of first contacts, forming first inductive coupling regions; and a second contact of each pair of second contacts is connected to second circuit trace from among the second circuit traces, and wherein each of the second circuit traces connected to second contacts include portions at least partly parallel with respect to second circuit traces connected to second contacts of adjacent pairs of second contacts, forming second inductive coupling regions;

wherein the first contacts connected to second circuit traces are not connected to the second contacts connected to second circuit traces, and wherein the first inductive coupling regions each have lengths that are shorter than lengths of the second inductive coupling regions.

2. The printed circuit board of claim 1, wherein a first circuit trace of a pair of contacts respectively crosses the associated other first circuit trace of the pair of contacts by means of plated-through holes.

3. The printed circuit board of claim 2, wherein the second circuit traces are connected to the second contacts via the plated-through holes.

4. The printed circuit board of claim 1, wherein slots are introduced into the printed circuit board between the pairs of second contacts and/or slots are introduced between the contacts of a pair of second contacts.

5. The printed circuit board of claim 4, wherein second coupling regions are at least partly arranged between the slots and the first coupling regions.

6. The printed circuit board of claim 4, wherein the second circuit traces connected to the second contacts extend at least partly around an inner end of a respective slot.

7. The printed circuit board of claim 1, wherein the second circuit traces connected to the first contacts are oriented at least in portions perpendicularly to the second circuit traces connected to the second contacts.

8. The printed circuit board of claim 1, wherein a ratio of the length of at least one second coupling region to the length of a respective adjacent first coupling region is about 1.1:1 to about 3:1.

9. The printed circuit board of claim 1, wherein the first contacts are embodied as insulation displacement contacts.

10. An electrical connector, wherein the electrical connector comprises a printed circuit board of claim 1.

11. The printed circuit board of claim 1, wherein the lengths of the first inductive coupling regions are non-uniform.

12. The printed circuit board of claim 1, wherein the lengths of the second inductive coupling regions are non-uniform.

13. The printed circuit board of claim 1, wherein the first inductive coupling regions are linear.

14. The printed circuit board of claim 1, wherein the second inductive coupling regions are non-linear.

15. The printed circuit board of claim 1, wherein the first inductive coupling regions are longitudinally aligned with at least one of the slots.

16. The printed circuit board of claim 1, wherein at least some of the second inductive coupling regions are disposed intermediate of the first inductive coupling regions and the slots.

* * * * *